United States Patent [19]
Weng et al.

[11] Patent Number: 5,126,097
[45] Date of Patent: Jun. 30, 1992

[54] FLUID FLOW SENSING AND SWITCHING DEVICE

[75] Inventors: Kuo-Liang Weng; Kuo-Lianq Weng, both of Taichung, Taiwan

[73] Assignee: Yu Feng Enterprise Co., Ltd., Taichung, Taiwan

[21] Appl. No.: 711,690

[22] Filed: Jun. 7, 1991

[51] Int. Cl.⁵ .......................................... H01H 35/18
[52] U.S. Cl. .................................. 307/118; 73/861.47; 73/861.74; 200/81.9 M; 200/82 E; 340/611
[58] Field of Search ............... 340/606, 610, 611; 73/239, 861.47, 861.71, 745, 861.74; 307/118; 200/81.9 R, 81.9 M, 82 E, 84 R, 84 C; 338/32 H; 335/205

[56] References Cited

U.S. PATENT DOCUMENTS

| | | | |
|---|---|---|---|
| 3,569,648 | 3/1971 | De Meyer | 200/81.9 M |
| 3,997,744 | 12/1976 | Higo | 200/84 C |
| 4,377,090 | 3/1983 | Seulen | 200/81.9 M |
| 4,645,887 | 2/1987 | Whiting | 200/82 E |
| 4,827,092 | 5/1989 | Kobold | 200/81.9 M |
| 4,841,107 | 6/1989 | Tandler | 200/84 C |
| 4,843,193 | 6/1989 | Budecker | 200/84 C |

Primary Examiner—Gerald P. Tolin
Attorney, Agent, or Firm—Browdy and Neimark

[57] ABSTRACT

The present invention is related to the fluid flow sensing and switching device installed in an air-conditioning system, particularly in a heat exchanger, which has a hollow body or housing to accommodate a metallic sensing member with a pair of conductive terminals extending out thereof, while it is further sealed by resin. A ring member is slidably mounted with a pair of legs extending downwardly from the hollow body, which is positioned facing the fluid flow, so as to activate the metallic sensing means and further to control a compressor connected with the system.

1 Claim, 3 Drawing Sheets

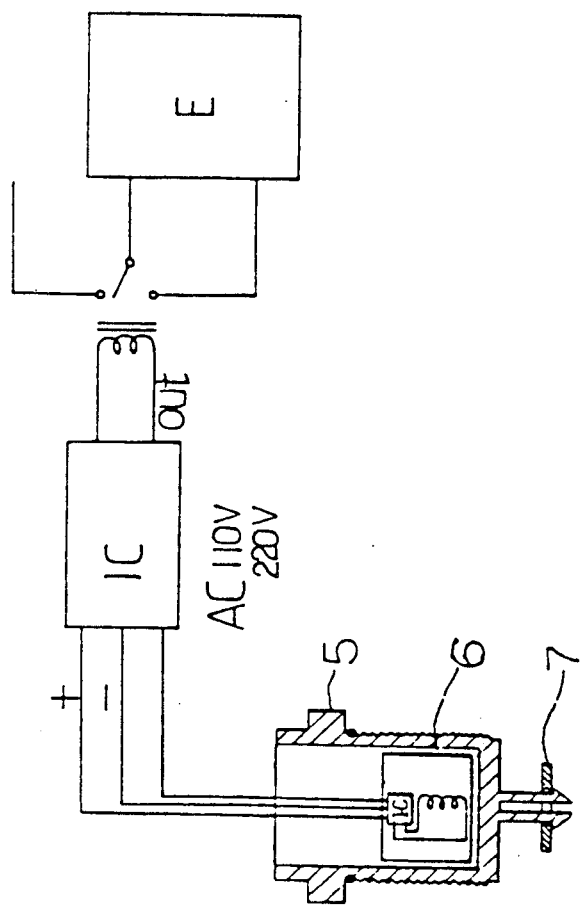
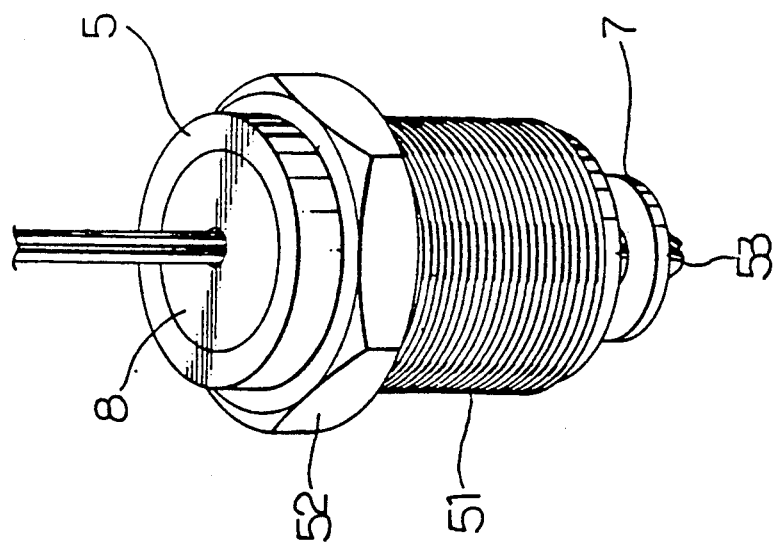

FLUID FLOW SENSING AND SWITCHING DEVICE

BACKGROUND OF THE INVENTION

The present invention is related to a fluid flow sensing device, particularly to the type having a ring member to sense the fluid flow and to actuate a metallic sensing means, so as to control a compressor.

A prior art fluid flow sensor 1 shown in FIG. 1 has a spring 2 to laterally bias a level 4 extending from the sensor 1, and a probe 3 connected to the level 4. While the fluid flows in a tube as indicated by an arrow shown in dashed line, it forces the probe to activate the fluid flow sensor, so as to control a compressor.

However, it is observed that the components of the prior art device are relatively complicated and particularly, not suitable for installation in a small diameter tube. Moreover, since the spring and level are exposed to the fluid, corrosion of the elements is common.

SUMMARY OF THE INVENTION

The present invention utilizes a ring member slidedly engaged on a pair of legs integrally extending from a hollow body. Fluid which flows flows against the ring element will activate a sensing member sealed in the hollow body when the ring element moves upward toward the sensing member.

Therefore, it is an object of the present invention to provide a sensing device which is simple in construction and cheap to manufacture.

It is still an object of the present invention to provide a novel construction of a fluid flow sensing device to overcome the disadvantages set forth above.

Other advantages and objectives will be appreciated as the invention becomes better understood by reference to the following description when considered in connection with the accompanying drawings.

BRIEF DESCRIPTION OF THE DRAWINGS

FIG. 2 is a perspective view of an embodiment according to the present invention;

FIG. 3 is a schematic view showing the electric circuit thereof;

DETAILED DESCRIPTION OF THE PREFERRED EMBODIMENT

Referring to FIG. 2 to FIG. 7, a fluid device according to the present invention generally comprises a hollow body 5, a metallic sensing member 6 and a ring member 7. The hollow body 5 defines a space, in which the metallic sensing member 6 is accommodated. Furthermore, the space is filled with resin filling designated by numeral 8 for sealing purposes. A pair of conductive terminals extend out out of the hollow body 5 and electrically connect with a magnifying circuit to activate a relay, so as to control a compressor E.

Figure 1:
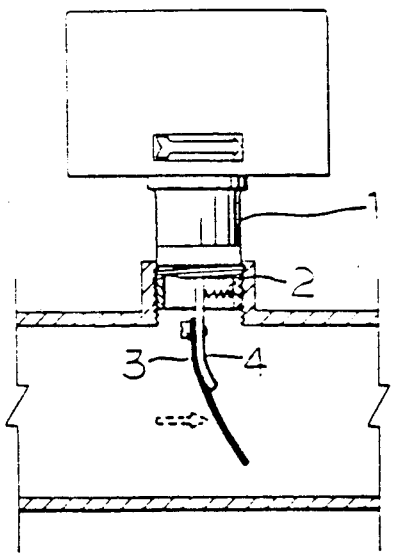
FIG. 1 is a cross section view showing a conventional fluid flow sensor.
Figure 4:
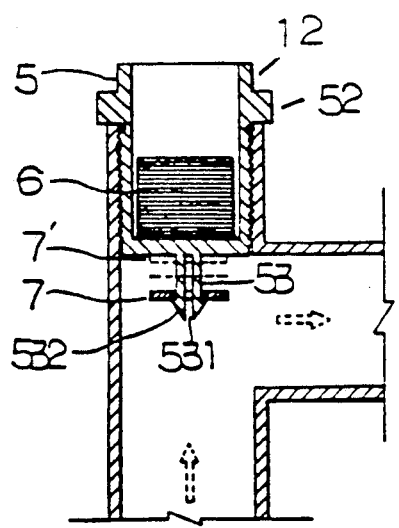
FIG. 4 and 5 are cross section views showing the fluid flow sensing and switching device in application.
Figure 5:
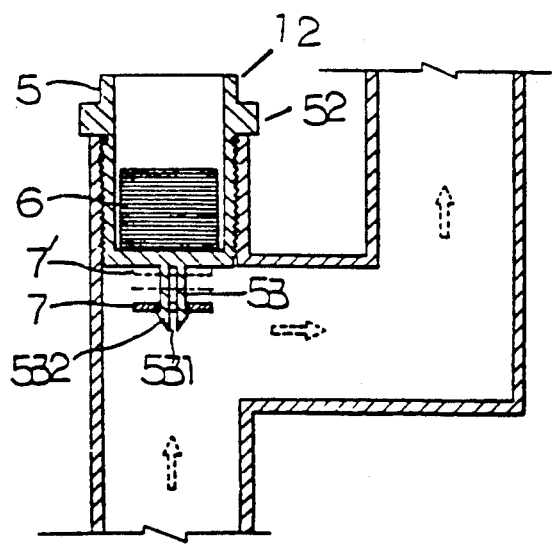
Figure 7:
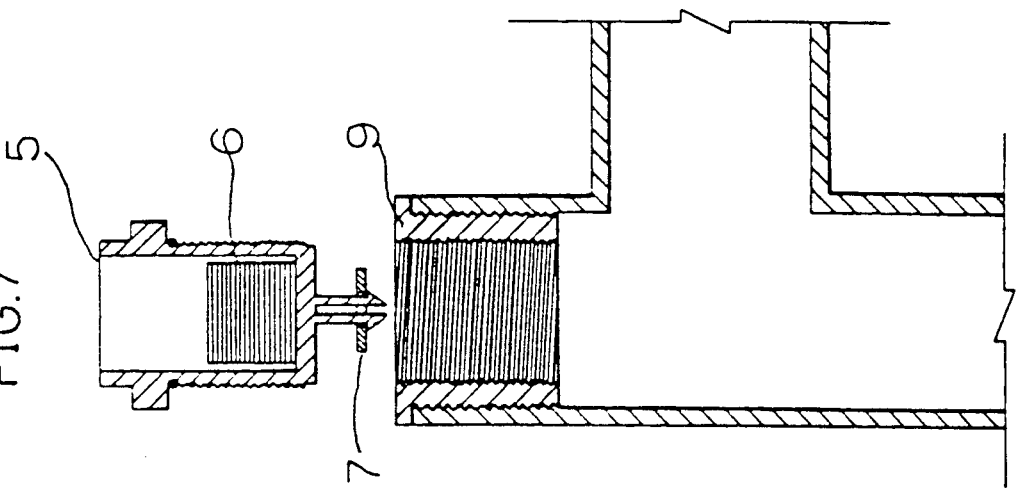
FIG. 7 shows the fluid flow sensing switching device being connected to a larger pipe by means of an adaptor 9.

The body 5 has a threaded portion 51 to be engaged with a threaded tubular member shown particularly in FIG. 4 and 5, a head 52 portion 12, typically a hexical screw head, and a pair of legs 53 extending downwardly. In addition, the legs defines a space 531 therebetween, and sloped stops 532 integrally formed thereon, such that the legs can be inserted through an opening 71 of the ring member 7.

Figure 6:
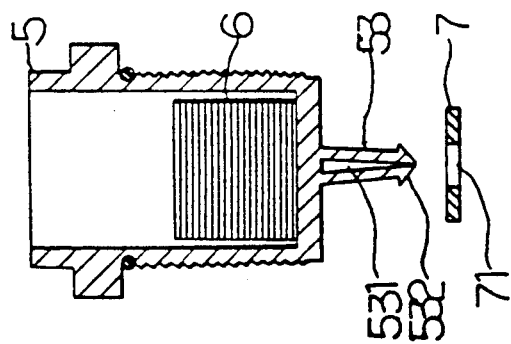
FIG. 6 shows the replacement of ring member.

Referring particularly to FIG. 6, when the ring member is inserted, the legs are urged inwardly to allow the opening 71 to pass over the sloped stops 532. Since the opening 71 is slightly larger than the circumference defined by the legs, but smaller than the stops 532, the ring member 7 is free to move up and down legs 53 in response to flow of fluid on the ring member 7.

As shown in FIG. 4 and 5 the sensing and switching device according to the present invention, is installed in a tube, through which fluid flows. The ring member 7 when subjected to a steady pressure caused by the fluid moves upwardly, which movement is designated by numeral 7' and shown by the phantom line FIGS. 4 and 5. The coil of the metallic sensing member 6 shown in FIG. 3 is actuated by this movement and will send a signal magnified by an IC circuit to control a compressor. When the fluid supply is insufficient, the body weight of the ring member permits the ring member to move downwardly. Therefore, the compressor will be switched off to avoid overheating.

The present embodiment of the present invention has been described herein and shown in the accompanying drawings to illustrate the underlying principle of the invention, but it is to be understood that numerous modification may be made without departing from the spirit and scope of this invention.

What is claimed is:

1. A fluid flow sensing and switching device for an air conditioning or heat exchange system, comprising:

a hollow body having a threaded portion engaged with a housing of said system;

said hollow body having a head portion to facilitate the threading engagement and a pair of legs extending downward into the fluid being sensed;

a metallic sensing member disposed in said hollow body above said legs;

a resin filling in said hollow body to seal said metallic sensing member in said hollow body;

a movable ring member having a through hole which receives said legs of said hollow body;

a pair or conductive terminals connected to said sensing member and extending outwardly from said hollow body to transmit the signal created by said metallic sensing member by movement of said movable ring member;

wherein said ring member moves along said legs according to the fluid flowing in said system; and said legs define a space therebetween so that said legs can be urged inwardly to facilitate the insertion or removal of said ring member.

* * * * *